(12) United States Patent
Hudait et al.

(10) Patent No.: US 8,124,959 B2
(45) Date of Patent: Feb. 28, 2012

(54) HIGH HOLE MOBILITY SEMICONDUCTOR DEVICE

(75) Inventors: Mantu K. Hudait, Portland, OR (US); Suman Datta, Beaverton, OR (US); Robert S. Chau, Beaverton, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 616 days.

(21) Appl. No.: 11/823,516

(22) Filed: Jun. 28, 2007

(65) Prior Publication Data

US 2009/0001350 A1     Jan. 1, 2009

(51) Int. Cl.
*H01L 29/06* (2006.01)
*H01L 31/0328* (2006.01)

(52) U.S. Cl. ............................. 257/14; 257/17

(58) Field of Classification Search ............ 257/14, 257/13, 17
See application file for complete search history.

(56) References Cited

U.S. PATENT DOCUMENTS

| | | | | |
|---|---|---|---|---|
| 4,672,405 A | * | 6/1987 | Derkits, Jr. ............... | 327/119 |
| 4,868,612 A | * | 9/1989 | Oshima et al. ............ | 257/14 |
| 4,974,038 A | * | 11/1990 | Delagebeaudeuf et al. | 257/192 |
| 5,436,468 A | * | 7/1995 | Nakata et al. ............ | 257/15 |
| 5,568,501 A | * | 10/1996 | Otsuka et al. ............ | 372/46.01 |
| 6,486,490 B1 | * | 11/2002 | Kano ........................ | 257/13 |
| 6,559,471 B2 | * | 5/2003 | Finder et al. ............. | 257/22 |
| 6,654,153 B2 | * | 11/2003 | Kaneko ...................... | 359/248 |
| 6,711,195 B2 | * | 3/2004 | Chang et al. ............. | 372/45.01 |
| 6,927,412 B2 | * | 8/2005 | Takahashi et al. ....... | 257/13 |
| 7,095,542 B2 | * | 8/2006 | Yu et al. .................. | 359/248 |
| 7,675,117 B2 | * | 3/2010 | Atanackovic ........... | 257/366 |
| 2008/0029756 A1 | * | 2/2008 | Hudait et al. ............ | 257/14 |

OTHER PUBLICATIONS

U.S. Appl. No. 11/647,989, filed Dec. 29, 2006, entitled "Improved Dopant Confinement in the Delta Doped Layer Using a Dopant Segregation Barrier in Quantum Well Structures," by Mantu K. Hudait, et al.

U.S. Appl. No. 11/498,685, filed Aug. 2, 2006, entitled "Semiconductor Buffer Architecture for III-V Devices on Silicon Substrates," by Mantu K. Hudait, et al.

U.S. Appl. No. 11/498,901, filed Aug. 2, 2006, entitled "Stacking Fault and Twin Blocking Barrier for Integrating III-V on Si," by Mantu K. Hudait, et al.

C.L.A. Cerny, et al., "P-Channel, Ion Implanted, GaAsSb/InAlAs HIGFETs on InP for Digital and Microwave Applications," 1995, pp. 2253-2259.

J. Tantillo, et al., "P-HFET's With GaAsSb Channel," 1989, pp. 316-320.

* cited by examiner

*Primary Examiner* — Ori Nadav
(74) *Attorney, Agent, or Firm* — Trop, Pruner & Hu, P.C.

(57) ABSTRACT

One embodiment of the invention includes a high hole mobility p-channel $GaAs_ySb_{1-y}$ quantum well with a silicon substrate and an $In_xAl_{1-x}As$ barrier layer.

12 Claims, 2 Drawing Sheets

HIGH HOLE MOBILITY SEMICONDUCTOR DEVICE

BACKGROUND

Quantum well (QW) semiconductor devices based on group III-V materials, such as indium arsenide (InAs), indium antimonide (InSb), indium gallium arsenide (InGaAs), can be formed on silicon (Si) substrates. These devices may use GaAs as a coating on a Si substrate to create a "virtual" polar substrate, which may result in a defect density greater than $E^8$-$E^{10}$/cm$^2$. In addition, quantum well devices may use large bandgap indium aluminum arsenide (InAlAs) barrier layers for hole confinement in the InGaAs QW grown either on GaAs or indium phosphide (InP) substrates for p-channel quantum well field effect transistors (QWFETs) for the complementary part of the n-channel InGaAs QWFET. Such devices may suffer from low two-dimensional hole mobility due to the lower valence band offset between the QW and the barrier layer. This offset may result in poor hole confinement inside the InGaAs channel material. Further still, the devices may have defects (e.g., stacking faults and twins) and dislocations (e.g., threading dislocations) that propagate inside the quantum well due to, for example, lattice-mismatch issues as well as polar-on-nonpolar material growth on Si without the proper buffer layer architecture in between the QW and the starting substrate.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

Figure 1:
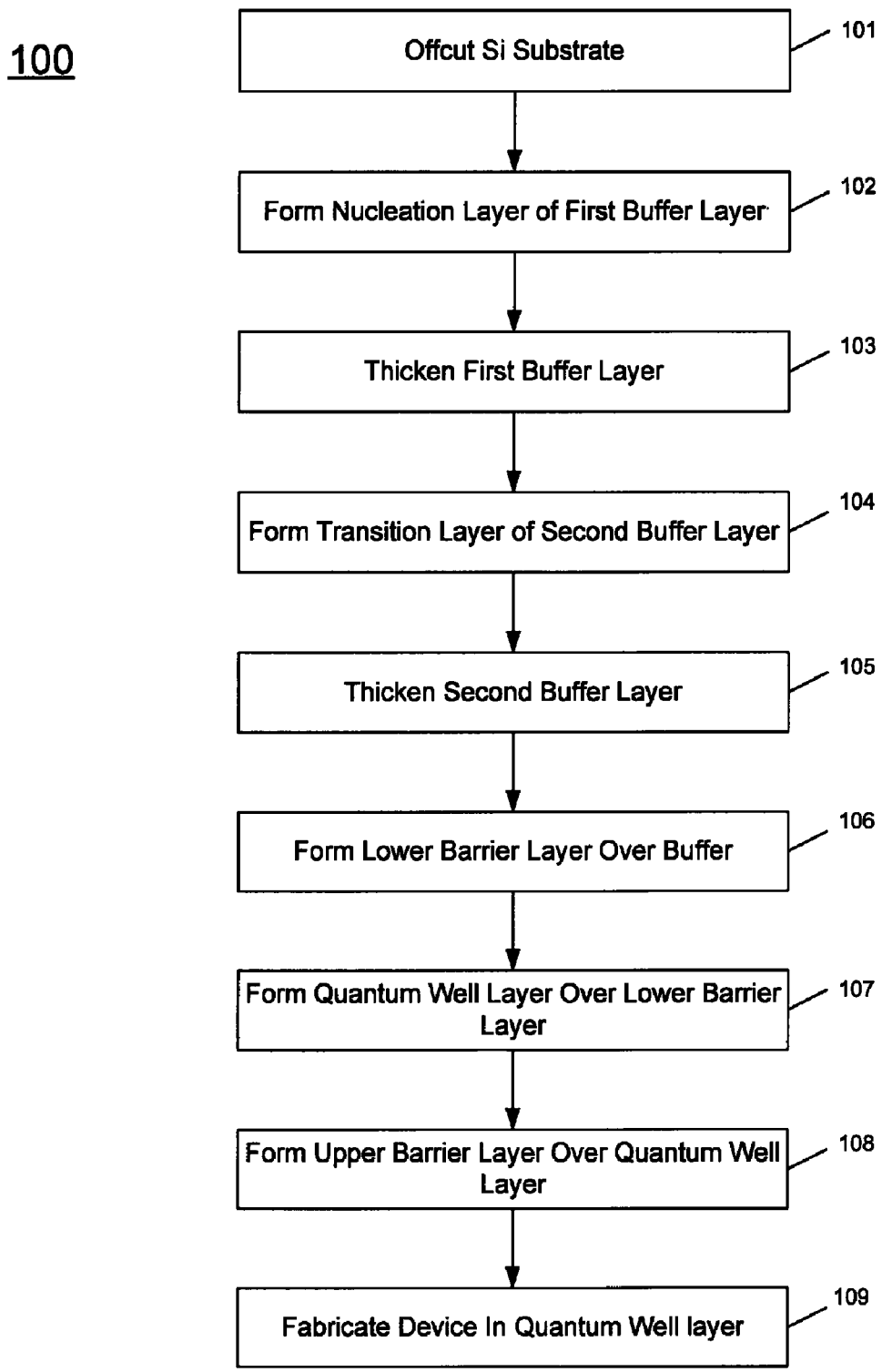
FIG. 1 is a method in one embodiment of the invention.

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

One embodiment of the invention includes an architecture for integrating a high hole mobility p-channel gallium arsenide antimonide (GaAsSb) QW device structure on a Si substrate to produce low-power, high-speed III-V compound semiconductor based CMOS device applications.

In one embodiment of the invention, a GaAsSb QW (e.g., GaAs$_{0.51}$Sb$_{0.49}$) and indium aluminum arsenide (InAlAs) barrier layer (e.g., In$_{0.52}$Al$_{0.48}$As) have a large valence band offset (Ev~0.78 eV) that provides hole confinement inside the type-I QW. In contrast, a conventional InGaAs QW with an InAlAs barrier layer may have a valence band offset of only 0.2 eV, resulting in poor hole confinement.

In addition, in embodiments of the invention that include a Si substrate, GaAsSb QW, and an InAlAs barrier layer, strain may be provided in the QW to enhance the hole mobility in the channel. For example, with a GaAs$_y$Sb$_{1-y}$ well and a y less than 0.51, the quantum well will be compressive strained. Also, with a barrier layer (upper or lower barrier layer) including In$_x$Al$_{1-x}$As, where x is less than 0.52, the QW will be compressively strained. Furthermore, a GaAs$_y$Sb$_{1-y}$ quantum well and a y less than 0.51, along with a barrier layer (upper or lower barrier layer) including In$_x$Al$_{1-x}$As, where x is less than 0.52, may result in a QW that is compressively strained. However, in some embodiments of the invention, the device may unstrained, dislocation free, and lattice matched using, for example, GaAs$_{0.51}$Sb$_{0.49}$ and In$_{0.52}$Al$_{0.48}$As.

In one embodiment of the invention, a buffer may be included to bridge material mismatch issues (e.g., anti-phase domains, stacking faults, and twins) between the active GaAsSb channel layer and the Si substrate. The buffer may include a dual consisting of a GaAs layer grown on the Si substrate, followed by a graded (forward-normal grading or reverse-inverse grading) InAlAs layer formed on the GaAs layer. This may ensure the full layer is fully (100%) relaxed before the QW layer growth. If this is not the case, the defects may propagate inside the QW due to further relaxation of the buffer layer during subsequent growth of layers on top of buffer layer. The composite buffer layer may bridge the lattice constant differential that exists between the Si substrate and the GaAsSb channel layer due to the presence of intermediate lattice constants. The composite buffer and barrier layers may also provide device isolation and, in some embodiments of the invention, may eliminate parallel conduction from the buffer layer or through the Si substrate to the channel layer due to the large bandgap. Larger bandgap materials may demonstrate insulating properties. Thus, a tradeoff may exist between the strain relaxation (as well as removing of dislocations by dislocation glide) and the bandgap consideration. It may be difficult to relax the strain in large bandgap materials.

FIG. 1 is a flow diagram of a method to fabricate a III-V device layer in accordance with an embodiment of the present invention. Method 100 begins with an (100) offcut of 2-6 degree towards <110> direction p-type silicon (nonpolar) substrate at step 101. At step 102, a nucleation layer is formed as the initial step of a two step process to form a first buffer layer. This nucleation layer, formed on top of the nonpolar offcut Si substrate, may eliminate the anti-phase domains that may originate from III-V polar-on-nonpolar growth as well as create a "virtual" polar substrate on the nonpolar semiconductor substrate. At step 103, the first buffer layer is thickened with a growth process distinct from that used at step 102. In step 104, a transition layer is formed as the initial step of a two step process to form a second buffer layer upon the first buffer layer. Then, at step 105, the second buffer layer is thickened with a growth process distinct from that used at step 104. In step 106, a lower barrier layer is formed over the composite buffer. Then, at step 107 a quantum well layer is formed over the barrier layer. At step 108, an upper barrier layer is formed over the quantum well layer. The upper barrier layer or lower barrier layer may optionally be doped. For example, the upper barrier layer or lower barrier layer may be a composite barrier layer including a spacer layer, dopant segregation barrier layer, delta doped layer, and respective upper or lower barrier layer. Then, at step 109 a device is fabricated in the quantum well layer. Each of these steps is discussed in greater detail below in reference to FIG. 2.

Figure 2:
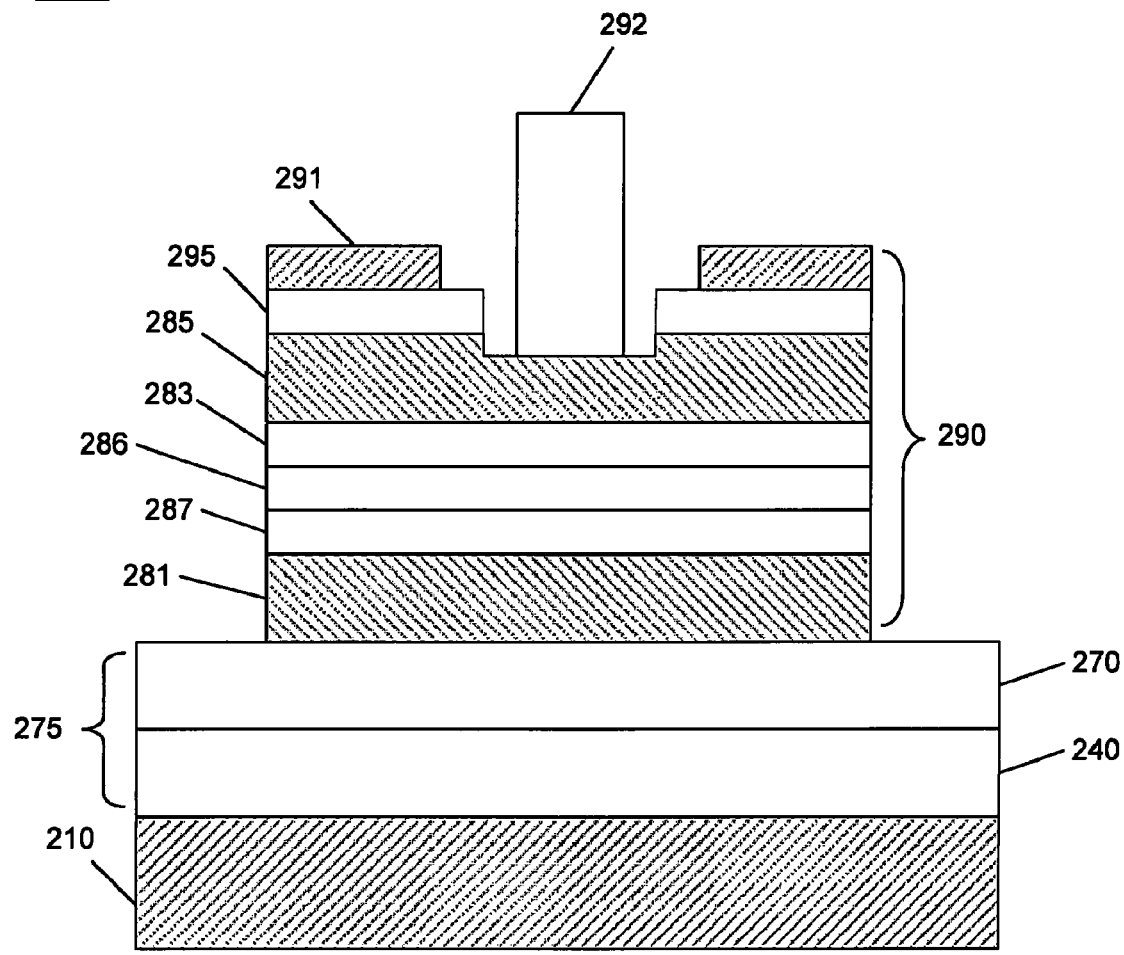
FIG. 2 is a side cross-sectional view of a semiconductor device in one embodiment of the invention.

FIG. 2 depicts one embodiment of the invention. A quantum well 283 is formed between an upper barrier layer 285 and a lower barrier layer 281. The lower barrier layer 281 is formed upon a composite buffer 275 over silicon substrate 210. The silicon substrate may be a high resistivity (1Ω-50 kΩ-cm) n-type or p-type Si substrate with (100) off-cut in the range of 2°-8° towards [110] direction.

A composite buffer 275 may be formed over the substrate 210. The buffer 275 may include a lower layer 240 that has a thin GaAs nucleation layer grown at low temperature. The GaAs buffer layer (0.2 μm-1 μm) may be subjected to thermal cycle annealing to reduce dislocations. A second GaAs buffer layer may be grown in the range of 0.2-5 μm at higher temperature with high structural quality. Furthermore, an inverse graded or graded $In_xAl_{1-x}As$ buffer layer 270 (e.g., $In_{0.52}Al_{0.48}As$) of 0.5-2 μm thickness may be grown on top of the GaAs layer 240.

Lower barrier layer 281 may be formed of a higher band gap material than the quantum well 283. The lower barrier layer 281 is of sufficient thickness to provide a potential barrier to charge carriers in the transistor channel. In one embodiment, the lower barrier layer thickness is between about 100 Å and about 250 Å. In one embodiment, the lower barrier is $In_xAl_{1-x}As$ between 2 um and 5 um thick. In still other embodiments, lower barrier layer 281 is microns thick to further reduce defect density in the quantum well 283.

The lower barrier 281 may be fully relaxed. In certain embodiments wherein the composite buffer 275 is comprised of a GaAs buffer layer 240 and a graded $In_xAl_{1-x}As$ buffer layer 270, the lower barrier layer 281 is comprised of $In_xAl_{1-x}As$. In some embodiments the lower barrier layer 281 comprises between about 30% and 50% aluminum, ($In_xAl_{1-x}As$, with x=0.7-0.5). In a particular embodiment, the lower barrier layer 281 is $In_{0.52}Al_{0.48}As$ with 48% aluminum. In some embodiments, the $In_xAl_{1-x}As$ lower barrier layer 281 is grown between approximately 400 C and 445 C and followed by annealing at higher temperature to relax the buffer layer since the dislocation glide is the thermally activated process. In one embodiment, the annealing temperature is 495 C for the duration of 15 min after the graded InAlAs buffer is grown on top of the GaAs. In general, the higher aluminum concentration, the higher the growth temperature. In a specific embodiment, a lower barrier layer 281 with 48% aluminum ($In_{0.52}Al_{0.48}As$) is grown at 495 C.

In one embodiment of the invention, over the lower barrier layer 281 a quantum well 283 is formed of a material with a smaller band gap than that of the lower barrier. In an embodiment wherein the composite buffer 275 comprises a GaAs buffer layer 240 and $In_xAl_{1-x}As$ buffer layer 270, the quantum well 283 is doped or undoped and formed of $GaAs_ySb_{1-y}$. In some embodiments, where the quantum well layer 283 is formed of $GaAs_ySb_{1-y}$, the growth temperature is between approximately 450 C and 600 C. In a specific embodiment, the $GaAs_ySb_{1-y}$ quantum well layer 283 includes $GaAs_{0.51}Sb_{0.49}$ and is grown at 495 C.

Quantum well 283 is of a sufficient thickness to provide adequate channel conductance. In a particular embodiment, the thickness of the quantum well 283 is between about 10 nm and about 50 nm. In certain embodiments quantum well layer 283 is below its critical thickness so that additional defects are not introduced due to lattice mismatch. The quantum well layer 283 may be strained by the lower barrier layer 281, the upper barrier layer 285, or both.

In one embodiment of the invention, over the quantum well 283 is the upper barrier layer 285. Upper barrier layer 285 has a larger band gap than the quantum well 283, thereby confining a majority of charge carriers within the quantum well 283 for reduced device leakage. The upper barrier layer 285 may be formed of the same or different materials as the lower barrier layer 281 and in one embodiment. In certain embodiments wherein the composite buffer 275 comprises a GaAs layer 240 and $In_xAl_{1-x}As$ layer 270, the upper barrier layer 285 comprises $In_xAl_{1-x}As$. In some embodiments the upper barrier layer 285 comprises between about 30% and 50% aluminum, ($In_xAl_{1-x}As$, with x=0.7-0.5). At above approximately 40% aluminum, the upper device layer may oxidize upon removal from the deposition chamber. In a particular embodiment, the upper barrier layer 285 is $In_xAl_{1-x}As$ with 48% aluminum ($In_{0.52}Al_{0.48}As$). In an alternative embodiment, the upper barrier layer 285 may contain greater than 48% aluminum. In such an embodiment, a capping layer (not shown) may be deposited on the upper barrier layer 285 in order to reduce the contact resistance during source and grain fabrication in transistor process flow.

Additionally, the amount of strain induced in the quantum well layer 283 may be tailored by controlling the thickness and lattice mismatch with the lower barrier layer 281 and upper barrier layer 285. In a specific embodiment, wherein the quantum well 283 is $GaAs_{0.51}Sb_{0.49}$ and the lower barrier layer 281 and upper barrier layer 285 are composed of $In_{0.52}Al_{0.48}As$, the quantum well layer 283 is not compressively strained. However, in another embodiment compressive strain is introduced when quantum well 283 includes $GaAs_ySb_{1-y}$ and y is less than 0.51. In another embodiment compressive strain is introduced when the lower barrier layer includes $In_xAl_{1-x}As$ and x is less than 0.52. In another embodiment of the invention, compressive strain is introduced when quantum well 283 includes $GaAs_ySb_{1-y}$ and y is less than 0.51 and the lower barrier layer includes $In_xAl_{1-x}As$ and x is less than 0.52.

In one embodiment of the invention, doped layer 287 is Be or C-delta doped. The doped layer 287 may also be beryllium (Be) or carbon (C)-doped $In_xAl_{1-x}As$ (e.g., $In_{0.52}Al_{0.48}As$) for two-dimensional hole gas formation inside the GaAsSb QW. In another embodiment doped layer 287 is modulation doped. The doping may be done using Be as one example. In one embodiment the doped layer 287 is delta doped and has a thickness of approximately 3 Å to 5 Å. In other embodiments the doped layer 287 is modulation doped and has a thickness between approximately 5 Å and 50 Å. The doped layer 287 may be above or below the quantum well 283.

In some embodiments a spacer layer 286 may also be included above or below (i.e., inverted doping structure) the quantum well. For example, the spacer layer 286 may be immediately below the quantum well 283. The doped layer 287 may be immediately below the spacer layer 286. Using this approach, the top barrier thickness can be reduced for enhancement mode device applications. In other embodiments, the spacer layer 286 may be immediately above the quantum well 283 and the doped layer 287 may be immediately above the spacer layer 286. The spacer layer 286 may include $In_xAl_{1-x}As$ (e.g., $In_{0.52}Al_{0.48}As$).

In a particular embodiment, spacer layer 286 is between approximately 30 Å and 100 Å thick, delta doped layer 287 is less than 25 Å thick, and upper barrier layer 285 is between approximately 50 Å and 500 Å thick in order to confine two-dimensional hole gas (2DHG) carriers in the quantum well 283. Spacer layer 286 may be grown between approximately 450 C and 600 C, and range from 30 to 100 nm thick.

Deposition and growth temperature for upper barrier layer 285 may also be reduced in order to reduce delta dopant segregation. In one embodiment, an upper barrier layer 285 and spacer layer 286 are deposited at a lower temperature range of approximately 400 C to 550 C. The lower temperature range of 400 C to 550 C, as opposed to 450 C to 600 C, may help reduce out diffusion and surface migration of the delta dopant, which, in some embodiments, may be characterized as possessing a comparatively higher vapor pressure than components of the top barrier layer 285.

In an embodiment, top barrier layer 285 is deposited between approximately 450 C and 600 C to a thickness of less than or equal to approximately 50 Å. In an alternative embodiment top barrier layer 285 is grown to a thickness of up to 500 Å. Reduction in growth temperature for the top barrier layer 285 can also assist in reducing out diffusion by reducing the effects of vapor pressure.

Finally, a highly-doped source drain layer 295 is formed above the upper barrier layer 285. In a particular embodiment, the source drain layer 295 is p++ doped InGaAs or GaAsSb between about 30 Å to about 500 Å thick.

Source and drain contact metallizations 291 are then formed by commonly known deposition processes, such as electron beam evaporation or reactive sputtering. In various embodiments, a mask material is used to selectively remove a portion of the semiconductor device stack in preparation for the placement of the gate electrode. Depending on whether a depletion mode or enhancement mode device is desired, selective etches may be used to form a recess having a particular depth. In certain embodiments implementing an enhancement mode device it is desirable to place the gate electrode close to the delta doped layer. In such an embodiment the top barrier layer 285 may be etched to a thickness of less than approximately 50 Å. In alternative embodiments implementing a depletion mode device, it may be desirable to have a thicker top barrier layer 285.

In particular embodiments, source drain layer 295 is removed during the gate recess etch to expose a suitable Schottky surface on the upper barrier layer 285. Commonly known dry or wet etch techniques may be utilized to form the gate recess. The etchant may be selective to the composition of the semiconductor, for example, in an embodiment, an p++ doped indium gallium arsenide (InGaAs) source drain layer 295 is selectively removed using a wet etch process comprised of citric acid and peroxide. Through application of similar commonly known selective etch techniques, the recess etch depth may be tightly controlled by terminating on a stop layer grown upon the upper barrier layer 285 (not shown).

The gate electrode 292 is formed over the upper barrier layer 285. In some embodiments of the present invention, commonly known techniques are used to form the gate electrode 292 directly on the upper barrier layer 285, thereby creating Schottky junction through which the gate controls the quantum well 283. In other embodiments, commonly known techniques are used to form the gate electrode 292 on a dielectric layer over the upper barrier layer 285, thereby creating a MOS junction. In particular embodiments, the gate electrode 292 is formed using commonly known lift-off methods relying on lithography and highly directional deposition techniques, such as electron beam deposition, to separate the gate electrode 292 from the source drain layer 295.

Then, the quantum well transistor 290 is isolated using commonly known techniques. In particular embodiments, the epitaxial device layer of the quantum well transistor 290 is etched through to form an active device mesa upon the composite buffer 275 over silicon substrate 210. The isolation etch removes the source drain layer 289, upper barrier 285, quantum well 283 and lower barrier 281 along a perimeter of the active device to form the mesa. As previously described, the isolative character of the composite buffer 275 provides sufficient device isolation between the transistor 290 and neighboring devices. Thus, in particular embodiments, the isolation etch is stopped when the composite buffer 275 is exposed. This enables device isolation to be achieved with minimal topography. With the quantum well transistor 290 substantially complete, backend processing is performed using commonly known techniques to connect quantum well transistor 290 to the external environment.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a nonpolar substrate, the nonpolar substrate including silicon;
   a buffer layer formed above the nonpolar substrate;
   a lower barrier layer formed above the buffer layer, the lower barrier layer including In, Al, and As, and having a first valence energy band;
   a quantum well formed above the lower barrier layer, the quantum well including Ga, As, and Sb, and having a second valence energy band; and
   an upper barrier layer formed above the quantum well;
   wherein the buffer layer includes a buffer lower layer formed below and in direct contact with a buffer upper layer, the buffer lower layer including Ga and As and the buffer upper layer including In, Al, and As.

2. The apparatus of claim 1, wherein the buffer upper layer, the lower barrier layer, a spacer layer formed above the buffer upper layer, a doped layer formed above the buffer upper layer, and the upper barrier layer each include $In_xAl_{1-x}As$.

3. The apparatus of claim 1, wherein the quantum well includes $GaAs_ySb_{1-y}$ and y is less than 0.51 and the quantum well is compressive strained.

4. The apparatus of claim 1, wherein the quantum well includes $GaAs_{0.51}Sb_{0.49}$.

5. The apparatus of claim 4, wherein the lower barrier layer includes $In_{0.52}Al_{0.48}As$.

6. The apparatus of claim 1, wherein the quantum well includes $GaAs_ySb_{1-y}$, the lower barrier layer includes $In_xAl_{1-x}As$, and x is less than 0.52.

7. The apparatus of claim 6, wherein the quantum well is compressive strained.

8. The apparatus of claim 1, wherein the nonpolar substrate is offcut (100) between 2 or more degrees and 6 or fewer degrees.

9. The apparatus of claim 1, further including a first valence energy band offset based on the first valence energy band and the second valence energy band, the first valence energy band offset being at least 0.65 eV.

10. The apparatus of claim 1, further comprising a doped layer formed below the quantum well.

11. The apparatus of claim 1, wherein no additional layer is located between the buffer lower layer and the buffer upper layer.

12. The apparatus of claim 1, wherein the buffer lower layer is located directly under the buffer upper layer.

* * * * *